United States Patent
Xue

(10) Patent No.: US 10,950,155 B1
(45) Date of Patent: Mar. 16, 2021

(54) GOA CIRCUIT AND DISPLAY PANEL

(71) Applicant: SHENZHEN CHINA STAR OPTOELECTRONICS SEMICONDUCTOR DISPLAY TECHNOLOGY CO., LTD., Guangdong (CN)

(72) Inventor: Yan Xue, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 16/755,583

(22) PCT Filed: Mar. 27, 2020

(86) PCT No.: PCT/CN2020/081564
§ 371 (c)(1),
(2) Date: Apr. 12, 2020

(51) Int. Cl.
*G09G 3/20* (2006.01)

(52) U.S. Cl.
CPC ....... *G09G 3/20* (2013.01); *G09G 2300/0809* (2013.01); *G09G 2310/0267* (2013.01)

(58) Field of Classification Search
CPC ............. G09G 3/20; G09G 2300/0809; G09G 2310/0267
See application file for complete search history.

(56) References Cited

U.S. PATENT DOCUMENTS

| | | | | |
|---|---|---|---|---|
| 5,859,630 A * | 1/1999 | Huq | ...................... | G09G 3/3677 345/100 |
| 8,830,156 B2 * | 9/2014 | Kim | ....................... | G11C 19/28 345/100 |
| 9,245,891 B2 * | 1/2016 | Umezaki | ................ | H01H 71/02 |
| 2007/0296681 A1 * | 12/2007 | Kim | ...................... | G11C 19/184 345/100 |
| 2008/0048712 A1 * | 2/2008 | Ahn | ....................... | H03K 17/161 326/21 |
| 2010/0097368 A1 * | 4/2010 | Hwang | ................ | G09G 3/3677 345/213 |
| 2013/0249884 A1 * | 9/2013 | Kim | ..................... | G09G 3/3677 345/212 |
| 2015/0171833 A1 * | 6/2015 | Pi | ........................... | H03K 3/012 327/109 |
| 2019/0066596 A1 * | 2/2019 | Xue | ..................... | G11C 19/184 |
| 2020/0027383 A1 * | 1/2020 | Chen | ........................ | G09G 3/20 |
| 2020/0035180 A1 * | 1/2020 | Chen | ..................... | G09G 3/3677 |
| 2020/0135286 A1 * | 4/2020 | Li | ......................... | G09G 3/3677 |
| 2020/0357341 A1 * | 11/2020 | Xue | ..................... | G09G 3/3266 |

* cited by examiner

*Primary Examiner* — Dmitriy Bolotin
(74) *Attorney, Agent, or Firm* — Mark M. Friedman

(57) ABSTRACT

A GOA circuit and a display panel are provided. The GOA circuit could reduce the number of transistors electrically connected to the first node in the GOA circuit. Thus, the number of the current leakage paths is also reduced. In addition, the GOA circuit could real-time compensate the pixel circuit in the blank time period and thus raise the stability of the GOA circuit.

18 Claims, 5 Drawing Sheets

| GOA signal | Voltage setting | |
|---|---|---|
| | Min.(V) | Max.(V) |
| Cout(n-2) | -13 | +20 |
| Cout(n+2) | -13 | +20 |
| LSP | -13 | +20 |
| VST | -13 | +20 |
| Total reset | -13 | +20 |
| CK1 | -13 | +20 |
| CK2 | -13 | +20 |
| CK3 | -13 | +20 |
| VGH | +20 | |
| VGL1 | -13 | |
| VGL2 | -10 | |
| VGL3 | -6 | |

…

GOA CIRCUIT AND DISPLAY PANEL

FIELD OF THE INVENTION

The present invention relates to a display technique, and more particularly, to a GOA circuit and a display panel.

BACKGROUND OF THE INVENTION

The gate driver on array (GOA) technique represents a technique integrating gate driving circuits on the array substrate of the display panel to drive the panel line by line. In this way, the gate driver circuit portion could be eliminated to reduce the cost and realize a design of the narrow side frame. Therefore, the GOA technique has been adopted in various kinds of displays. However, the GOA circuit is very complicated and the tolerance of the threshold value variance is comparatively low and thus the stability is low.

SUMMARY OF THE INVENTION

One objective of an embodiment of the present invention is to provide a GOA circuit and a display panel to solve the above-mentioned issue of low circuit stability.

According to an embodiment of the present invention, a GOA circuit is disclosed. The GOA circuit comprises a plurality of GOA circuits connected in series, each of the GOA circuits comprises a pull-up control module, a pull-down control module, a pull-up module, a first pull-down module, a second pull-down module, a first pull-down maintaining module, a second pull-down maintaining module, a logical addressing module and an inverter module. The pull-up control module receives a stage signal of a previous stage and is electrically connected to a first node and a fourth node, and the pull-up control module is configured to output the stage signal of the previous stage to the first node under control of the stage signal and a voltage level of the fourth node. The pull-up module receives a first clock signal, a second clock signal and a third clock signal and is electrically connected to the first node, a fifth node, a sixth node and a seventh node, and the pull-up module is configured to output a stage signal of a current stage, a first scan signal of the current stage and a second scan signal of the current stage under control of a voltage level of the first node. The first pull-down module receives a stage signal of a next stage and a first low reference signal and is electrically connected to the first node and the fourth node, and the first pull-down module is configured to pull-down the voltage level of the first node according to the voltage level of the fourth node, the stage signal of the next stage and the first low reference signal. The second pull-down module receives the stage signal of the previous stage, a reset signal and a second low reference signal and is electrically connected to a second node and a third node, the second pull-down module is configured to pull down a voltage level of the second node according to the reset signal, the second low reference signal and a voltage level of the third node. The first pull-down maintaining module receives the first low reference signal and is electrically connected to the first node, the second node and the fourth node, the first pull-down maintaining module is configured to maintain the voltage level of the first node according to the first low reference signal, a voltage of the second node and a voltage of the fourth node after the first pull-down module pulls down the voltage level of the first node. The second pull-down maintaining module receives the first low reference signal and a third low reference signal and is electrically connected to the second node, the fifth node, the sixth node and the seventh node, and the second pull-down maintaining module is configured to maintain voltage levels of the stage signal of the current stage, the first scan signal of the current stage and the second scan signal of the current stage according to the first low reference signal, the third low reference signal and the voltage of the second node. The logical addressing module receives the stage signal of the previous stage, a high reference signal, the first low reference signal, the reset signal, a first control signal, and a second control signal and is electrically connected to the first node and the second node, and the logical addressing module is configured to control the voltage level of the first node according to the stage signal of the previous stage, the high reference signal, the reset signal, the first control signal and the voltage level of the second node in a blank time period. The inverter module receives the second low reference signal and the high reference signal and is electrically connected to the first node and the second node and the inverter module is configured to keep the voltage level of the second node has an inverting phase of the voltage level of the first node.

According to an embodiment of the present invention, the pull-up control module comprises: an 11th transistor and a 12th transistor; wherein a gate and a source of the 11th transistor and a gate of the 12th transistor receive the stage signal of the previous stage, a drain of the 11th transistor and a source of the 12th transistor are electrically connected to the fourth node, and a drain of the 12th transistor is electrically connected to the first node.

According to an embodiment of the present invention, the pull-up module comprises: a 6th transistor, a 21st transistor, a 22nd transistor, a 23rd transistor, a first capacitor, and a second capacitor; wherein a gate of the 6th transistor, a gate of the 21st transistor, a gate of the 22nd transistor, a gate of the 23rd transistor, a first end of the first capacitor and a first end of the second capacitor are electrically connected to the first node, a drain of the 6th transistor is electrically connected to the fourth node, a source of the 6th transistor, a second end of the first capacitor and a drain of the 22nd transistor are electrically connected to the sixth node, a source of the 21st transistor receives the third clock signal, a drain of the 21st transistor and a second end of the second capacitor are electrically connected to the seventh node, a source of the 22nd transistor receives the second clock signal, a source of the 23rd transistor receives the first clock signal, and a drain of the 23rd transistor is electrically connected to the fifth node.

According to an embodiment of the present invention, the first pull-down unit comprises: a 31st transistor and a 32nd transistor; a gate of the 31st transistor and a gate of the 32nd transistor receive the stage signal of the next stage, a drain of the 31st transistor is electrically connected to the first node, a source of the 31st transistor and a drain of the 32nd transistor are electrically connected to the fourth node, and a source of the 32nd transistor is electrically connected to the first low reference signal.

According to an embodiment of the present invention, the second pull-down unit comprises: a 55th transistor, a 101st transistor, and a 102nd transistor; wherein a gate of the 55th transistor receives the stage signal of the previous stage, a source of the 55th transistor and a source of the 102nd transistor receive the second low reference signal, a drain of the 55th transistor and a drain of the 101st transistor are electrically connected to the second node, a drain of the 102nd transistor is electrically connected to the third node, a drain of the 102nd transistor is electrically connected to a source of the 101st transistor, and a gate of the 101st transistor receives the reset signal.

According to an embodiment of the present invention, the first pull-down maintaining unit comprises: a 44th transistor and a 45th transistor; wherein a gate of the 44th transistor and a gate of the 45th transistor are electrically connected to the second node, a drain of the 44th transistor is electrically connected to the first node, a source of the 44th transistor and a drain of the 45th transistor are electrically connected to the fourth node, and a source of the 45th transistor receives the first low reference signal.

According to an embodiment of the present invention, the second pull-down maintaining unit comprises a 41st transistor, a 42nd transistor and a 43rd transistor; wherein a gate of the 41st transistor, a gate of the 42nd transistor and a gate of the 43rd transistor are electrically connected to the second node, a source of the 41st transistor and a source of the 42nd transistor receive the third low reference signal, a drain of the 41st transistor is electrically connected to the seventh node, a drain of the 42nd transistor is electrically connected to the sixth node, a source of the 43rd transistor is electrically connected to the first low reference signal, and a drain of the 43rd transistor is electrically connected to the fifth node.

According to an embodiment of the present invention, the logical addressing module comprises: a 33rd transistor, a 34th transistor, a 71st transistor, a 72nd transistor, a 73rd transistor, a 81st transistor, a 82nd transistor and a third capacitor; wherein a gate of the 33rd transistor is electrically connected to the second node, a source of the 33rd transistor receives the first low reference signal, a drain of the 33rd transistor is electrically connected to a source of the 34th transistor, a gate of the 34th transistor receives the first control signal, a drain of the 34th transistor is electrically connected to a drain of the 81st transistor and a source of the 82nd transistor, a gate of the 81st transistor, a gate of the 73rd transistor, a drain of the 72nd transistor and a second end of the third capacitor are electrically connected to the third node, a source of the 81st transistor is electrically connected to a drain of the 73rd transistor, a gate of the 82nd transistor receives the reset signal, a drain of the 82nd transistor is electrically connected to the first node, a first end of the third capacitor receives the high reference signal, a gate of the 71st transistor and a gate of the 72nd transistor receive the second control signal, a source of the 71st transistor receives the stage signal of the previous stage, a drain of the 71st transistor, a source of the 72nd transistor and a source of the 73rd transistor are electrically connected.

According to an embodiment of the present invention, the inverter module comprises: a 51st transistor, a 52nd transistor, a 53rd transistor and a 54th transistor; wherein a gate and a source of the 51st transistor and a source of the 53rd transistor receive the high reference signal, a drain of the 51st transistor, a gate of the 53rd transistor and a drain of the 52nd transistor are electrically connected, a drain of the 53rd transistor and a source of the 54th transistor are electrically connected to the second node, a drain of the 54th transistor and a source of the 52nd transistor receive the second low reference signal, a gate of the 54th transistor and a gate of the 52nd transistor are electrically connected to the first node.

According to an embodiment of the present invention, a display panel is disclosed. The display panel comprises a GOA circuit. The GOA circuit comprises a plurality of GOA circuits connected in series, each of the GOA circuits comprises a pull-up control module, a pull-down control module, a pull-up module, a first pull-down module, a second pull-down module, a first pull-down maintaining module, a second pull-down maintaining module, a logical addressing module and an inverter module. The pull-up control module receives a stage signal of a previous stage and is electrically connected to a first node and a fourth node, and the pull-up control module is configured to output the stage signal of the previous stage to the first node under control of the stage signal and a voltage level of the fourth node. The pull-up module receives a first clock signal, a second clock signal and a third clock signal and is electrically connected to the first node, a fifth node, a sixth node and a seventh node, and the pull-up module is configured to output a stage signal of a current stage, a first scan signal of the current stage and a second scan signal of the current stage under control of a voltage level of the first node. The first pull-down module receives a stage signal of a next stage and a first low reference signal and is electrically connected to the first node and the fourth node, and the first pull-down module is configured to pull-down the voltage level of the first node according to the voltage level of the fourth node, the stage signal of the next stage and the first low reference signal. The second pull-down module receives the stage signal of the previous stage, a reset signal and a second low reference signal and is electrically connected to a second node and a third node, the second pull-down module is configured to pull down a voltage level of the second node according to the reset signal, the second low reference signal and a voltage level of the third node. The first pull-down maintaining module receives the first low reference signal and is electrically connected to the first node, the second node and the fourth node, the first pull-down maintaining module is configured to maintain the voltage level of the first node according to the first low reference signal, a voltage of the second node and a voltage of the fourth node after the first pull-down module pulls down the voltage level of the first node. The second pull-down maintaining module receives the first low reference signal and a third low reference signal and is electrically connected to the second node, the fifth node, the sixth node and the seventh node, and the second pull-down maintaining module is configured to maintain voltage levels of the stage signal of the current stage, the first scan signal of the current stage and the second scan signal of the current stage according to the first low reference signal, the third low reference signal and the voltage of the second node. The logical addressing module receives the stage signal of the previous stage, a high reference signal, the first low reference signal, the reset signal, a first control signal, and a second control signal and is electrically connected to the first node and the second node, and the logical addressing module is configured to control the voltage level of the first node according to the stage signal of the previous stage, the high reference signal, the reset signal, the first control signal and the voltage level of the second node in a blank time period. The inverter module receives the second low reference signal and the high reference signal and is electrically connected to the first node and the second node and the inverter module is configured to keep the voltage level of the second node has an inverting phase of the voltage level of the first node.

According to an embodiment of the present invention, the pull-up control module comprises: an 11th transistor and a 12th transistor; wherein a gate and a source of the 11th transistor and a gate of the 12th transistor receive the stage signal of the previous stage, a drain of the 11th transistor and a source of the 12th transistor are electrically connected to the fourth node, and a drain of the 12th transistor is electrically connected to the first node.

According to an embodiment of the present invention, the pull-up module comprises: a 6th transistor, a 21st transistor, a 22nd transistor, a 23rd transistor, a first capacitor, and a second capacitor; wherein a gate of the 6th transistor, a gate of the 21st transistor, a gate of the 22nd transistor, a gate of the 23rd transistor, a first end of the first capacitor and a first end of the second capacitor are electrically connected to the first node, a drain of the 6th transistor is electrically connected to the fourth node, a source of the 6th transistor, a second end of the first capacitor and a drain of the 22nd transistor are electrically connected to the sixth node, a source of the 21st transistor receives the third clock signal, a drain of the 21st transistor and a second end of the second capacitor are electrically connected to the seventh node, a source of the 22nd transistor receives the second clock signal, a source of the 23rd transistor receives the first clock signal, and a drain of the 23rd transistor is electrically connected to the fifth node.

According to an embodiment of the present invention, the first pull-down unit comprises: a 31st transistor and a 32nd transistor; a gate of the 31st transistor and a gate of the 32nd transistor receive the stage signal of the next stage, a drain of the 31st transistor is electrically connected to the first node, a source of the 31st transistor and a drain of the 32nd transistor are electrically connected to the fourth node, and a source of the 32nd transistor is electrically connected to the first low reference signal.

According to an embodiment of the present invention, the second pull-down unit comprises: a 55th transistor, a 101st transistor, and a 102nd transistor; wherein a gate of the 55th transistor receives the stage signal of the previous stage, a source of the 55th transistor and a source of the 102nd transistor receive the second low reference signal, a drain of the 55th transistor and a drain of the 101st transistor are electrically connected to the second node, a drain of the 102nd transistor is electrically connected to the third node, a drain of the 102nd transistor is electrically connected to a source of the 101st transistor, and a gate of the 101st transistor receives the reset signal.

According to an embodiment of the present invention, the first pull-down maintaining unit comprises: a 44th transistor and a 45th transistor; wherein a gate of the 44th transistor and a gate of the 45th transistor are electrically connected to the second node, a drain of the 44th transistor is electrically connected to the first node, a source of the 44th transistor and a drain of the 45th transistor are electrically connected to the fourth node, and a source of the 45th transistor receives the first low reference signal.

According to an embodiment of the present invention, the second pull-down maintaining unit comprises a 41st transistor, a 42nd transistor and a 43rd transistor; wherein a gate of the 41st transistor, a gate of the 42nd transistor and a gate of the 43rd transistor are electrically connected to the second node, a source of the 41st transistor and a source of the 42nd transistor receive the third low reference signal, a drain of the 41st transistor is electrically connected to the seventh node, a drain of the 42nd transistor is electrically connected to the sixth node, a source of the 43rd transistor is electrically connected to the first low reference signal, and a drain of the 43rd transistor is electrically connected to the fifth node.

According to an embodiment of the present invention, the logical addressing module comprises: a 33rd transistor, a 34th transistor, a 71st transistor, a 72nd transistor, a 73rd transistor, a 81st transistor, a 82nd transistor and a third capacitor; wherein a gate of the 33rd transistor is electrically connected to the second node, a source of the 33rd transistor receives the first low reference signal, a drain of the 33rd transistor is electrically connected to a source of the 34th transistor, a gate of the 34th transistor receives the first control signal, a drain of the 34th transistor is electrically connected to a drain of the 81st transistor and a source of the 82nd transistor, a gate of the 81st transistor, a gate of the 73rd transistor, a drain of the 72nd transistor and a second end of the third capacitor are electrically connected to the third node, a source of the 81st transistor is electrically connected to a drain of the 73rd transistor, a gate of the 82nd transistor receives the reset signal, a drain of the 82nd transistor is electrically connected to the first node, a first end of the third capacitor receives the high reference signal, a gate of the 71st transistor and a gate of the 72nd transistor receive the second control signal, a source of the 71st transistor receives the stage signal of the previous stage, a drain of the 71st transistor, a source of the 72nd transistor and a source of the 73rd transistor are electrically connected.

According to an embodiment of the present invention, the inverter module comprises: a 51st transistor, a 52nd transistor, a 53rd transistor and a 54th transistor; wherein a gate and a source of the 51st transistor and a source of the 53rd transistor receive the high reference signal, a drain of the 51st transistor, a gate of the 53rd transistor and a drain of the 52nd transistor are electrically connected, a drain of the 53rd transistor and a source of the 54th transistor are electrically connected to the second node, a drain of the 54th transistor and a source of the 52nd transistor receive the second low reference signal, a gate of the 54th transistor and a gate of the 52nd transistor are electrically connected to the first node.

The present invention could reduce the number of transistors electrically connected to the first node in the GOA circuit. Thus, the number of the current leakage paths is also reduced. In addition, the GOA circuit could real-time compensate the pixel circuit in the blank time period and thus raise the stability of the GOA circuit.

BRIEF DESCRIPTION OF THE DRAWINGS

To describe the technical solutions in the embodiments of this application more clearly, the following briefly introduces the accompanying drawings required for describing the embodiments. Apparently, the accompanying drawings in the following description show merely some embodiments of this application, and a person of ordinary skill in the art may still derive other drawings from these accompanying drawings without creative efforts.

DETAILED DESCRIPTION OF PREFERRED EMBODIMENTS

To help a person skilled in the art better understand the solutions of the present disclosure, the following clearly and completely describes the technical solutions in the embodiments of the present invention with reference to the accompanying drawings in the embodiments of the present invention. Apparently, the described embodiments are a part rather than all of the embodiments of the present invention. All other embodiments obtained by a person of ordinary skill in the art based on the embodiments of the present invention without creative efforts shall fall within the protection scope of the present disclosure.

In the following disclosure, the transistor could be a thin film transistor, a field effect transistor or any other device having similar characteristics. Because the source and the drain in a transistor are symmetric and thus they could be replaced with each other. In the following embodiments, in order to distinguish one from the other, one is designated as "source" and the other one is designate as "drain." In addition, in the figures, the middle of the switch transistor is the gate, the input end is the source and the output end is the drain. Furthermore, in the following embodiments, the transistors could be a P-type transistor or an N-type transistor, where P-type transistor is turned on when the gate receives a low voltage level and is turned off when the gate receives high voltage level and the N-type transistor is turned on when the gate receives a high voltage level and turned off when the gate receives a low voltage level.

Figure 1:
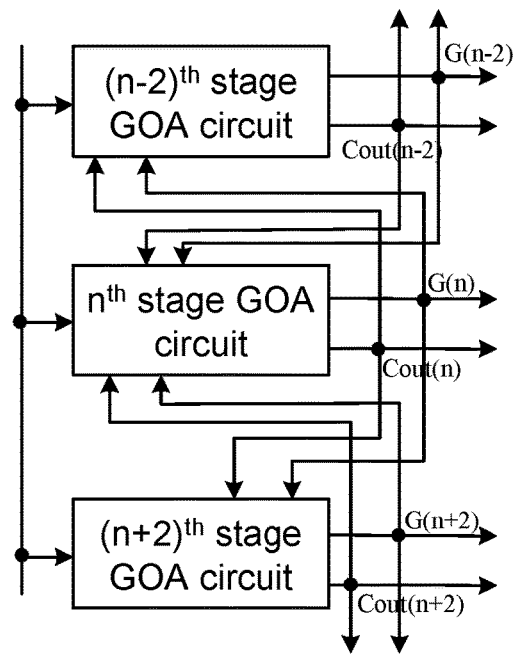
FIG. 1 is a diagram of a GOA circuit according to an embodiment of the present invention.

Please refer to FIG. 1. FIG. 1 is a diagram of a GOA circuit according to an embodiment of the present invention. As shown in FIG. 1, the GOA circuit comprises a plurality of GOA circuits connected in series. In this embodiment, $(n-2)^{th}$ stage GOA circuit, $n^{th}$ stage GOA circuit and $(n+2)^{th}$ stage GOA circuit are illustrated as an example.

When the $n^{th}$ stage GOA circuit is working, the scan signal outputted by the $n^{th}$ stage GOA circuit corresponds to a high voltage level, which is used to turn on switch transistors of the pixels of a row in the display panel. Furthermore, the data signal is outputted to charge the pixel electrodes of the pixels. The stage signal of the $n^{th}$ stage is used to control the $(n+2)^{th}$ stage GOA circuit. When the $(n+2)^{th}$ stage GOA circuit is working, the scan signal outputted by the $(n+2)^{th}$ stage GOA circuit corresponds to a high voltage level and the scan signal outputted by the $n^{th}$ stage GOA circuit corresponds to a low voltage level.

Figure 2:
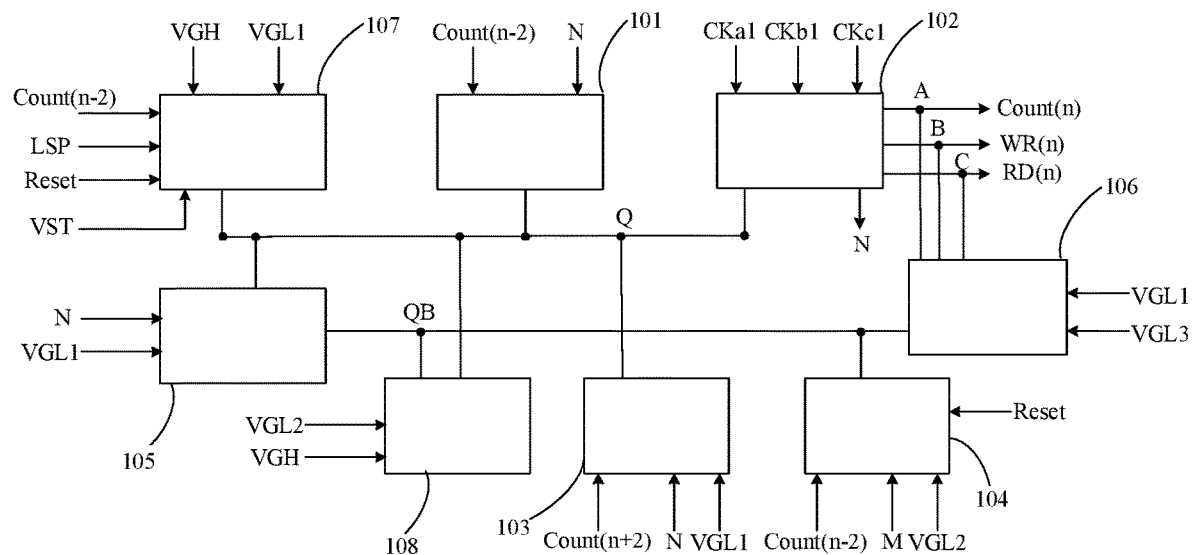
FIG. 2 is a diagram of a structure of a GOA circuit according to an embodiment of the present invention.

Please refer to FIG. 2. FIG. 2 is a diagram of a structure of a GOA circuit according to an embodiment of the present invention. As shown in FIG. 2, the GOA circuit comprises a pull-up control module 101, a pull-up module 102, a first pull-down module 103, a second pull-down module 104, a first pull-down maintaining module 105, a second pull-down maintaining module 106, a logical addressing module 107 and an inverter module 108.

The pull-up control module 101 receives a stage signal of a previous stage Cout(n−2) and is electrically connected to the first node Q and the fourth node N. The pull-up control module 101 is used to output the stage signal of the previous stage Cout(n−2) to the first node Q under the control of the stage signal of the previous stage Cout(n−2).

The pull-up module 102 receives a first clock signal CK1, a second clock signal CK2 and a third clock signal CK3 and is electrically connected to the first node Q, the fifth node A, the sixth node B and the seventh node C. The pull-up module 102 is used to output a stage signal of a current stage Cout(n), a first scan signal of the current stage WR(n) and a second scan signal of the current stage RD(n) under the control of the voltage level of the first node, the first clock signal CK1, the second clock signal CK2 and the third clock signal CK3.

The first pull-down module 103 receives a stage signal of a next stage Cout(n+2) and a first low reference signal VGL1 and is electrically connected to the first node Q and the fourth node N. The first pull-down module 103 is used to pull down the voltage level of the first node Q according to the voltage level of the fourth node N, the stage signal of the next stage Cout(n+2) and the first low reference signal VGL1.

The second pull-down module 104 receives the stage signal of the previous stage Cout(n−2), a reset signal Reset and a second low reference signal VGL2 and is electrically connected to a second node QB and a third node M. The second pull-down module 104 is used to pull down a voltage level of the second node QB according to the reset signal Reset, the second low reference signal VGL2 and a voltage level of the third node M.

The first pull-down maintaining module 105 receives the first low reference signal VGL1 and is electrically connected to the first node Q, the second node QB and the fourth node N. The first pull-down maintaining module 105 is used to maintain the low voltage level of the first node Q according to the first low reference signal VGL1, a voltage of the second node QB and a voltage of the fourth node N after the first pull-down module 103 pulls down the voltage level of the first node Q.

The second pull-down maintaining module 106 receives the first low reference signal VGL1 and a third low reference signal VGL3 and is electrically connected to the second node Oft the fifth node A, the sixth node B and the seventh node C. The second pull-down maintaining module 106 is used to maintain voltage levels of the stage signal of the current stage Cout(n), the first scan signal of the current stage WR(n) and the second scan signal of the current stage RD(n) according to the first low reference signal VGL1, the third low reference signal VGL3 and the voltage of the second node QR.

The logical addressing module 107 receives the stage signal of the previous stage Cout(n−2), a high reference signal VGH, the first low reference signal VGL1, the reset signal Reset, a first control signal LSP, and a second control signal VST and is electrically connected to the first node Q and the second node QB. The logical addressing module 107 is used to control the voltage level of the first node Q according to the stage signal of the previous stage Cout(n−2), the high reference signal VGH, the reset signal Reset, the first control signal LSP, the second control signal VST and the voltage level of the second node QB in a blank time period.

The inverter module 108 receives the second low reference signal VGL2 and the high reference signal VGH and is electrically connected to the first node Q and the second node QB. The inverter module 108 is used to keep the voltage level of the second node Q has an inverting phase of the voltage level of the first node Q.

In this embodiment, the GOA circuit reduces the number of transistors electrically connected to the first node. In this way, the number of paths of leakage currents is also reduced such that the stability of the GOA circuit is raised.

Figures 3, 4:
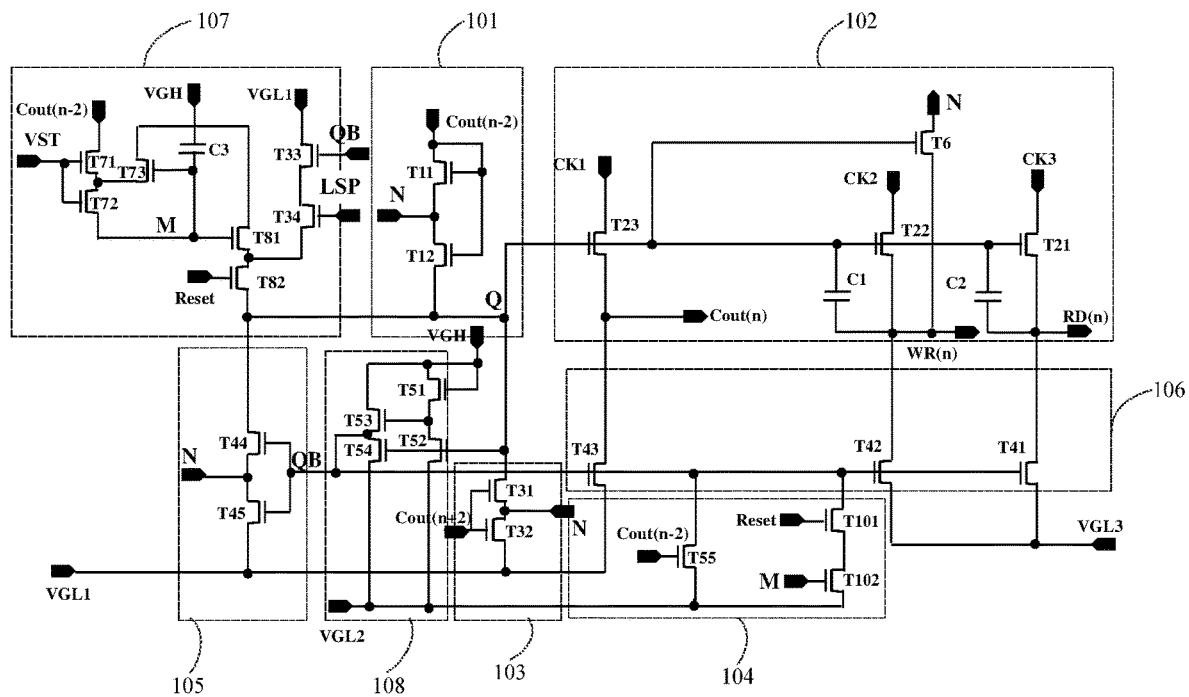
FIG. 3 is a diagram of a circuit of a GOA circuit according to an embodiment of the present invention.
FIG. 4 is a diagram showing voltage levels in the GOA circuit according to an embodiment of the present invention.

Please refer to FIG. 3. FIG. 3 is a diagram of a circuit of a GOA circuit according to an embodiment of the present invention. As shown in FIG. 3, the pull-up control module 101 comprises an $11^{th}$ transistor T11 and a $12^{th}$ transistor T12. The gate and the source of the $11^{th}$ transistor T11 and the gate of the $12^{th}$ transistor T12 receive the stage signal of the previous stage Cout(n−2). The drain of the $11^{th}$ transistor T11 and the source of the $12^{th}$ transistor T12 are electrically connected to the fourth node N. The drain of the $12^{th}$ transistor T12 is electrically connected to the first node Q.

The pull-up module 102 comprises a $6^{th}$ transistor T6, a $21^{st}$ transistor T21, a $22^{nd}$ transistor T22, a $23^{rd}$ transistor T23, a first capacitor C1, and a second capacitor C2. The gate of the $6^{th}$ transistor T6, the gate of the $21^{st}$ transistor T21, the gate of the $22^{nd}$ transistor T22, the gate of the $23^{rd}$ transistor T23, the first end of the first capacitor C1 and the first end of the second capacitor C2 are electrically connected to the first node Q. The drain of the $6^{th}$ transistor T6 is electrically connected to the fourth node N. The source of the $6^{th}$ transistor T6, a second end of the first capacitor C1 and the drain of the $22^{nd}$ transistor T22 are electrically connected to the sixth node B. The source of the $21^{st}$ transistor T21 receives the third clock signal CK3. The drain of the $21^{st}$ transistor T21 and a second end of the second capacitor C2 are electrically connected to the seventh node C. The source of the $22^{nd}$ transistor T22 receives the second clock signal CK2. The source of the $23^{rd}$ transistor T23 receives the first clock signal CK1. The drain of the $23^{rd}$ transistor T23 is electrically connected to the fifth node B.

The first pull-down unit 103 comprises a $31^{st}$ transistor T31 and a $32^{nd}$ transistor T32. The gate of the $31^{st}$ transistor T31 and the gate of the $32^{nd}$ transistor T32 receive the stage signal of the next stage Cout(n+2). The drain of the $31^{st}$ transistor T31 is electrically connected to the first node Q. The source of the $31^{st}$ transistor T31 and the drain of the $32^{nd}$ transistor T32 are electrically connected to the fourth node N. The source of the $32^{nd}$ transistor T32 is electrically connected to the first low reference signal VGL1.

The second pull-down unit 104 comprises a $55^{th}$ transistor T55, a $101^{st}$ transistor T101, and a $102^{nd}$ transistor T102. The gate of the $55^{th}$ transistor receives the stage signal of the previous stage Cout(n−2). The source of the $55^{th}$ transistor T55 and the source of the $102^{nd}$ transistor T102 receive the second low reference signal VGL2. The drain of the $55^{th}$ transistor T55 and the drain of the $101^{st}$ transistor T101 are electrically connected to the second node QB. The drain of the $102^{nd}$ transistor T102 is electrically connected to the third node M. The drain of the $102^{nd}$ transistor T102 is electrically connected to the source of the $101^{st}$ transistor T101. The gate of the $101^{st}$ transistor T101 receives the reset signal Reset.

The first pull-down maintaining unit 105 comprises a $44^{th}$ transistor T44 and a $45^{th}$ transistor T45. The gate of the $44^{th}$ transistor T44 and the gate of the $45^{th}$ transistor T45 are electrically connected to the second node QB. The drain of the $44^{th}$ transistor T44 is electrically connected to the first node Q. The source of the $44^{th}$ transistor T44 and the drain of the $45^{th}$ transistor T45 are electrically connected to the fourth node N. The source of the $45^{th}$ transistor T45 receives the first low reference signal VGL1.

The second pull-down maintaining unit 106 comprises a $41^{st}$ transistor T41, a $42^{nd}$ transistor T42 and a $43^{rd}$ transistor T43. The gate of the $41^{st}$ transistor T41, the gate of the $42^{nd}$ transistor T42 and the gate of the $43^{rd}$ transistor T43 are electrically connected to the second node QB. The source of the $41^{st}$ transistor T41 and the source of the $42^{nd}$ transistor T42 receive the third low reference signal VGL3. The drain of the $41^{st}$ transistor T41 is electrically connected to the seventh node C. The drain of the $42^{nd}$ transistor T42 is electrically connected to the sixth node B. The source of the $43^{rd}$ transistor is electrically connected to the first low reference signal VGL1. The drain of the $43^{rd}$ transistor T43 is electrically connected to the fifth node A.

The logical addressing module 107 comprises a $33^{rd}$ transistor T33, a $34^{th}$ transistor T34, a $71^{st}$ transistor T71, a $72^{nd}$ transistor T72, a $73^{rd}$ transistor T73, a $81^{st}$ transistor T81, a $82^{nd}$ transistor T82 and a third capacitor C3. The gate of the $33^{rd}$ transistor T33 is electrically connected to the second node QB. The source of the $33^{rd}$ transistor receives the first low reference signal VGL1. The drain of the $33^{rd}$ transistor T33 is electrically connected to the source of the $34^{th}$ transistor T34. The gate of the $34^{th}$ transistor T34 receives the first control signal LSP. The drain of the $34^{th}$ transistor T34 is electrically connected to the drain of the $81^{st}$ transistor T81 and the source of the $82^{nd}$ transistor T82. The gate of the $81^{st}$ transistor T81, the gate of the $73^{rd}$ transistor T73, the drain of the $72^{nd}$ transistor T72 and the second end of the third capacitor C3 are electrically connected to the third node M. The source of the $81^{st}$ transistor T81 is electrically connected to the drain of the $73^{rd}$ transistor T73. The gate of the $82^{nd}$ transistor T82 receives the reset signal Reset. The drain of the $82^{nd}$ transistor T82 is electrically connected to the first node Q. The first end of the third capacitor C3 receives the high reference signal VGH. The gate of the $71^{st}$ transistor T71 and the gate of the $72^{nd}$ transistor T72 receive the second control signal VST. The source of the $71^{st}$ transistor receives the stage signal of the previous stage Cout(n−2). The drain of the $71^{st}$ transistor T71, the source of the $72^{nd}$ transistor T72 and the source of the $73^{rd}$ transistor T73 are electrically connected.

The inverter module 108 comprises a $51^{st}$ transistor T51, a $52^{nd}$ transistor T52, a $53^{rd}$ transistor T53 and a $54^{th}$ transistor T54. The gate and the source of the $51^{st}$ transistor T51 and the source of the $53^{rd}$ transistor T53 receive the high reference signal VGH. The drain of the $51^{st}$ transistor T51, the gate of the $53^{rd}$ transistor T53 and the drain of the $52^{nd}$ transistor T52 are electrically connected. The drain of the $53^{rd}$ transistor T53 and the source of the $54^{th}$ transistor T54 are electrically connected to the second node QB. The drain of the $54^{th}$ transistor T54 and the source of the $52^{nd}$ transistor T52 receive the second low reference signal VGL2. The gate of the $54^{th}$ transistor T54 and the gate of the $52^{nd}$ transistor T52 are electrically connected to the first node Q.

In this embodiment, the GOA circuit reduces the number of transistors electrically connected to the first node. In this way, the number of paths of the leakage current from the first node Q is also reduced. Furthermore, in the GOA circuit, a depletion circuit is implemented. For example, the drain of the $11^{th}$ transistor and the source of the $12^{th}$ transistor are electrically connected to the fourth node N. The source of the $31^{st}$ transistor and the drain of the $32^{nd}$ transistor are electrically connected to the fourth node N. The source of the $31^{st}$ transistor and the drain of the $32^{nd}$ transistor are electrically connected to the fourth node N. The source of the $44^{th}$ transistor and the drain of the $45^{th}$ transistor are electrically connected to the fourth node N. When the first node Q corresponds to the high voltage level, the fourth node N corresponds to the high voltage level as well such that the leakage currents of the $11^{th}$ transistor, the $12^{th}$ transistor, the $31^{st}$ transistor, the $32^{nd}$ transistor, the $44^{th}$ transistor and the $45^{th}$ transistor are reduced. This further reduces the leakage current of the GOA circuit. In contrast to the conventional art, the stability of the GOA circuit is efficiently raised.

Figure 5:
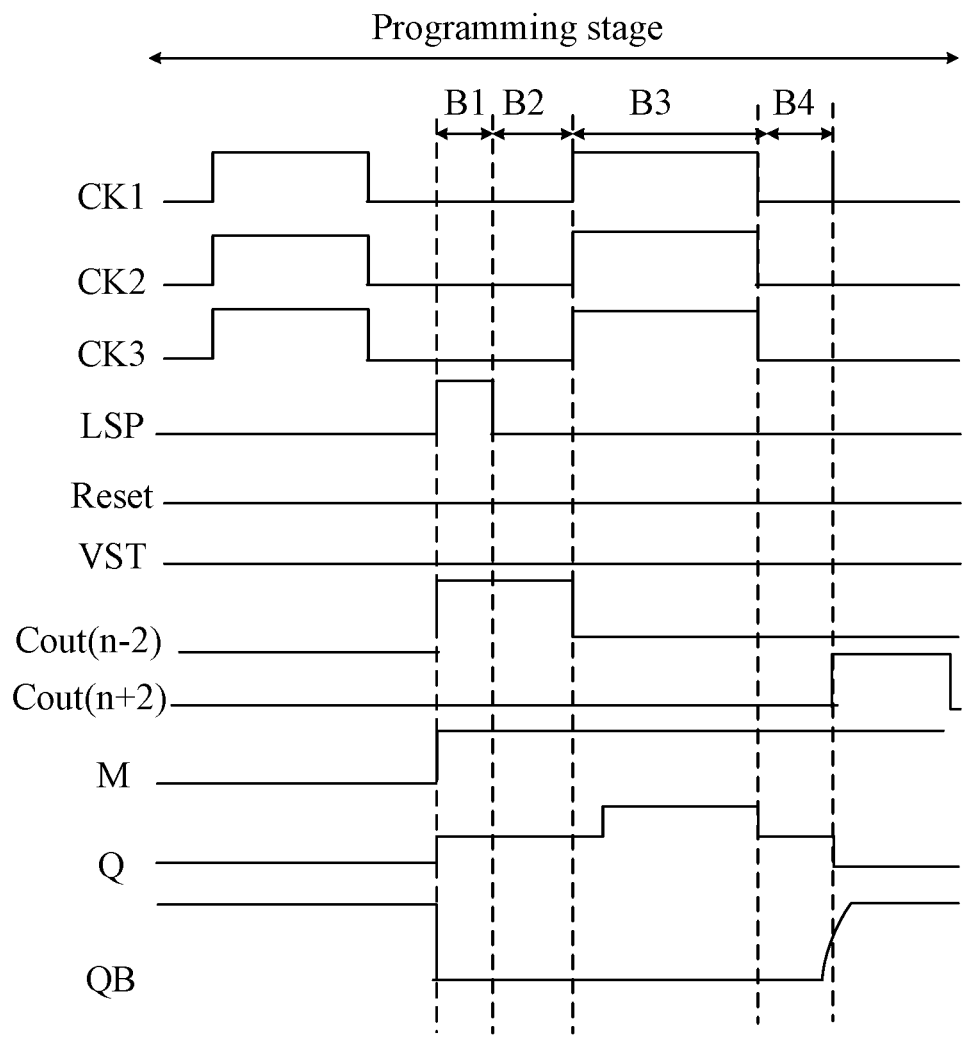
FIG. 5 is a first timing diagram of a GOA circuit according to an embodiment of the present invention.

Please refer to FIG. 4 and FIG. 5. FIG. 4 is a diagram showing voltage levels in the GOA circuit according to an embodiment of the present invention. FIG. 5 is a first timing diagram of a GOA circuit according to an embodiment of the present invention.

In the B1 phase, the stage signal of the previous stage Cout(n−2) corresponds to the high voltage level. The $11^{th}$ transistor T11 and the $12^{th}$ transistor T12 are turned on. The voltage level of the first node Q is pulled up to the high voltage level such that the $52^{nd}$ transistor, the $54^{th}$ transistor, the $21^{st}$ transistor, the $22^{nd}$ transistor and the $23^{rd}$ transistor are all turned on. Because the inverter module 108 is connected between the first node Q and the second node Oft the voltage level of the first node Q has an inverting phase of the voltage level of the second node QB. Therefore, the voltage level of the second node QB corresponds to the low voltage level such that the $41^{st}$ transistor, the $42^{nd}$ transistor, the $43^{rd}$ transistor, the $44^{th}$ transistor and the $45^{th}$ transistor are all turned off. In addition, the stage signal of the next stage Cout(n+2) corresponds to the low voltage level such that the $31^{st}$ transistor and the $32^{nd}$ transistor are turned off. The second control signal VST corresponds to the low voltage level such that the $33^{rd}$ transistor and the $34^{th}$ transistor are turned off. The first clock signal CK1, the second clock signal CK2 and the third clock signal CK3 correspond to the low voltage level. The stage signal of the current stage Cout(n), the first scan signal of the current stage WR(n) and the second scan signal of the current stage RD(n) all correspond to the low voltage level. The first control signal LSP corresponds to the high voltage level such that the $71^{st}$ transistor T71 and the $72^{nd}$ transistor T72 are turned on. The voltage level of the third node M is raised to the high voltage level such that the $81^{st}$ transistor T81 is turned on. The reset signal Reset corresponds to the low voltage level such that the $82^{nd}$ transistor T82 is turned off.

In the B1 phase, the stage signal of the previous stage Cout(n−2) corresponds to the high voltage level such that the $55^{th}$ transistor T55 is turned on. Because the source of the $55^{th}$ transistor T55 receives the second low reference signal, the $55^{th}$ transistor T55 outputs the low voltage signal and thus the voltage level of the second node QB is pulled down to the low voltage level. This makes the falling time of the second node QB is better.

In the B2 phase, the first control signal LSP transits from the high voltage level to the low voltage level such that the $71^{st}$ transistor T71 and the $72^{nd}$ transistor T72 are turned off. The voltage level of the third node M maintains its high voltage level and the voltage level of the first node Q maintains its high voltage level. The voltage level of the second node Oft the stage signal of the current stage Cout(n), the first scan signal of the current stage WR(n) and the second scan signal of the current stage RD(n) maintains their low voltage level.

In the B3 phase, the stage signal of the previous stage Cout(n−2) transits from the high voltage level to the low voltage level such that the $11^{th}$ transistor T11 and the $12^{th}$ transistor are turned off. The first clock signal CK1, the second clock signal CK2 and the third clock signal CK3 all transit from the low voltage level to the high voltage level. Therefore, the stage signal of the current stage Cout(n), the first scan signal of the current stage WR(n) and the second scan signal of the current stage RD(n) is pulled up to the high voltage level. In this phase, the first scan signal of the current stage WR(n) and the second scan signal of the current stage RD(n) charges the scan line corresponding to the GOA circuit of the current stage such that a row of the pixels corresponding to the scan line of the current stage. Thus, the row of the pixels is lightened.

Because of the first capacitor C1 and the second capacitor C2, the voltage level of the first node Q is coupled to a higher voltage level. This ensures that the $21^{st}$ transistor T21, the $22^{nd}$ transistor T22 and the $23^{rd}$ transistor T23 to be turned on. This further ensures that the stage signal of the current stage Cout(n), the first scan signal of the current stage WR(n) and the second scan signal of the current stage RD(n) to be corresponding to the high voltage level.

In the B4 phase, the first clock signal CK1, the second clock signal CK2 and the third clock signal CK3 all transit from the high voltage level to the low voltage level such that the stage signal of the current stage Cout(n), the first scan signal of the current stage WR(n) and the second scan signal of the current stage RD(n) are pulled down to the low voltage level.

Figure 6:
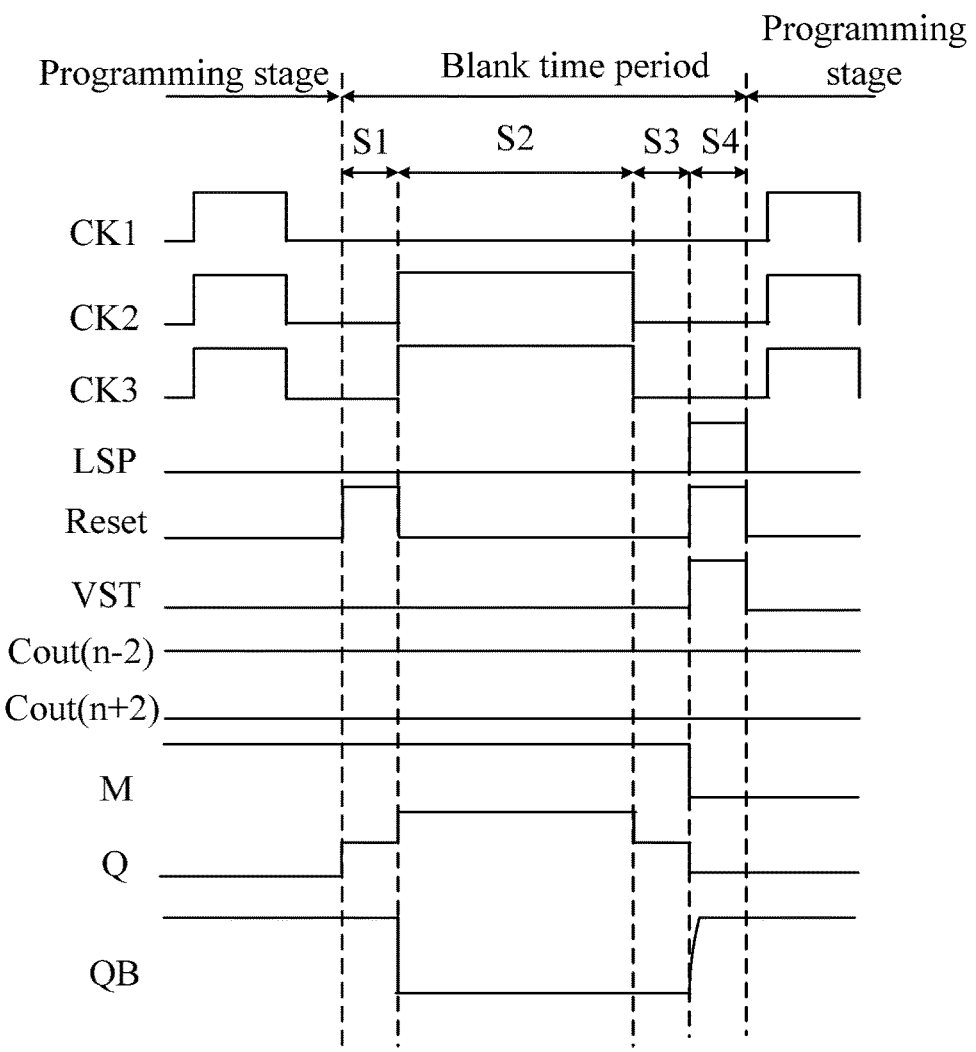
FIG. 6 is a second timing diagram of a GOA circuit according to an embodiment of the present invention.

Please refer to FIG. 4 and FIG. 6. FIG. 6 is a second timing diagram of a GOA circuit according to an embodiment of the present invention.

In the S1 phase, the reset signal Reset corresponds to the high voltage level such that the $82^{nd}$ transistor T82 is turned on. Thus, the voltage level of the first node Q is pulled-up to the high voltage level such that the $52^{nd}$ transistor T52, the $54^{th}$ transistor T54, the $21^{st}$ transistor T21, the $22^{nd}$ transistor T22 and the $23^{rd}$ transistor T23 are turned on. Because the inverter module 108 is connected between the first node Q and the second node Oft the voltage level of the first node Q has an inverting phase of the voltage level of the second node QB. Therefore, the second node QB corresponds to the low voltage level such that the $41^{st}$ transistor T41, the $42^{nd}$ transistor T42, the $43^{rd}$ transistor T43, the $44^{th}$ transistor T44 and the $45^{th}$ transistor T45 are all turned off. In addition, the stage signal of the next stage Cout(n+2) corresponds to the low voltage level such that the $31^{st}$ transistor T31 and the $32^{nd}$ transistor T32 are turned off. The second control signal VST corresponds to the low voltage level such that the $33^{rd}$ transistor T33 and the $34^{th}$ transistor T34 are turned off. The first clock signal CK1, the second clock signal CK2 and the third clock signal CK3 correspond to the low voltage level. The stage signal of the current stage Cout(n), the first scan signal of the current stage WR(n) and the second scan signal of the current stage RD(n) all correspond to the low voltage level.

In the S2 phase, the reset signal Reset transits from high voltage level to the low voltage level such that the $82^{nd}$ transistor T82 is turned off. The first clock signal CK1 maintains its low voltage level. The second clock signal CK2 and the third clock signal CK3 correspond to the high voltage level. This makes the stage signal of the current stage Cout(n) maintain its low voltage level and makes the first scan signal of the current stage WR(n) and the second scan signal of the current stage RD(n) correspond to the high voltage level. Furthermore, because of the first capacitor C1 and the second capacitor C2, the voltage level of the first node Q is coupled to a higher voltage level to ensure that the $21^{st}$ transistor T21, the $22^{nd}$ transistor T22 and the $23^{rd}$ transistor T23 are turned on. Therefore, this ensures that the stage signal of the current stage Cout(n) corresponds to the low voltage level and ensures that the first scan signal of the current stage WR(n) and the second scan signal of the current stage RD(n) correspond to the high voltage level.

In the S3 phase, the second clock signal CK2 and the third clock signal S3 correspond to the low voltage level. The voltage level of the first node Q is coupled to the high reference signal VGH. The first scan signal of the current stage WR(n) and the second scan signal of the current stage RD(n) are pulled down to the low voltage level.

In the S4 phase, the second control signal VST and the reset signal Reset transit from the low voltage level to the high voltage level. The $34^{th}$ transistor T34, the $82^{nd}$ transistor T82 and the $101^{st}$ transistor T101 are turned on. The voltage level of the third node M and the voltage level of the first node Q are pulled down to the low voltage level. The voltage level of the second node QB is pulled up to the high voltage level. The stage signal of the current stage Cout(n), the first scan signal of the current stage WR(n) and the second scan signal of the current stage RD(n) are pulled down to the low voltage level maintains their low voltage level.

The GOA circuit of an embodiment could compensate the pixel circuit in the blank time period. In a simulation of the GOA circuit, the GOA circuit could still work when the threshold voltage of the GOA circuit shifts −6V. The GOA circuit cannot work until the shift of threshold voltage of the GOA circuit reaches −8V. In contrast to the conventional art, the present invention could raise the stability of the GOA circuit and thus reduce the development difficulty of the TFT manufacturing.

Figure 7:
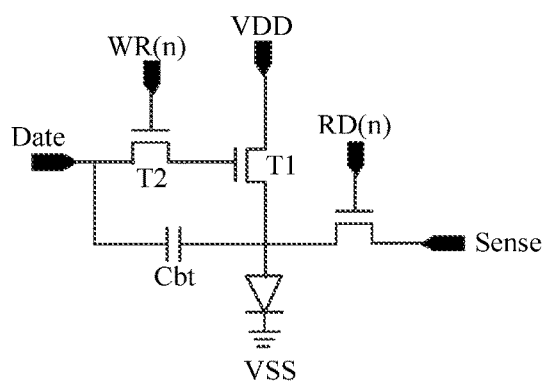
FIG. 7 is a diagram of a structure of a pixel structure according to an embodiment of the present invention.

Please note, the pixel circuit of an embodiment is shown in FIG. 7. FIG. 7 is a diagram of a structure of a pixel structure according to an embodiment of the present invention. The pixel circuit here could be understood by one having ordinary skills in the art and thus further illustration is omitted.

Figure 8:
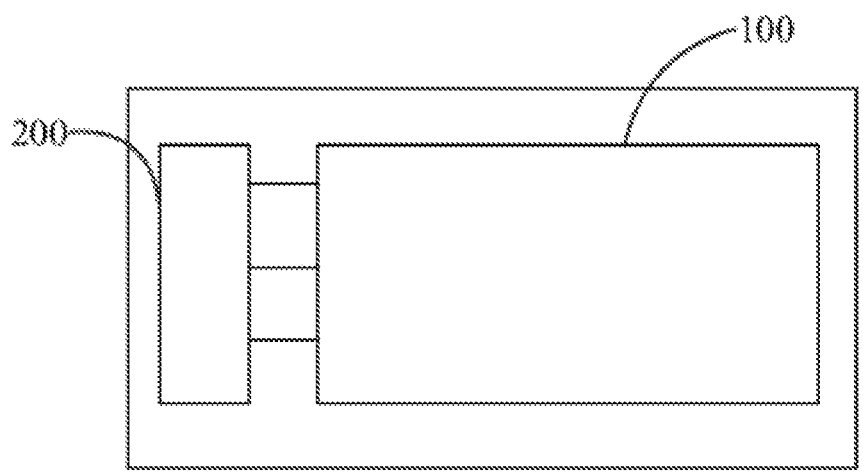
FIG. 8 is a diagram of a structure of a display panel according to an embodiment of the present invention.

Please refer to FIG. 8. FIG. 8 is a diagram of a structure of a display panel according to an embodiment of the present invention. As shown in FIG. 8, the display panel comprises a display area 100 and GOA circuit 200 integrated at the edge of the display area 100. Here, the GOA circuit 200 has a similar structure and similar operations of the above-mentioned embodiments and thus further illustration is omitted.

Above are embodiments of the present invention, which does not limit the scope of the present invention. Any modifications, equivalent replacements or improvements within the spirit and principles of the embodiment described above should be covered by the protected scope of the invention.

What is claimed is:

1. A gate driver on array (GOA) circuit, comprising:
a plurality of GOA circuits connected in series, each of the GOA circuits comprises a pull-up control module, a pull-down control module, a pull-up module, a first pull-down module, a second pull-down module, a first pull-down maintaining module, a second pull-down maintaining module, a logical addressing module and an inverter module;
wherein the pull-up control module receives a stage signal of a previous stage and is electrically connected to a first node and a fourth node, and the pull-up control module is configured to output the stage signal of the previous stage to the first node under control of the stage signal and a voltage level of the fourth node;
wherein the pull-up module receives a first clock signal, a second clock signal and a third clock signal and is electrically connected to the first node, a fifth node, a sixth node and a seventh node, and the pull-up module is configured to output a stage signal of a current stage, a first scan signal of the current stage and a second scan signal of the current stage under control of a voltage level of the first node;
wherein the first pull-down module receives a stage signal of a next stage and a first low reference signal and is electrically connected to the first node and the fourth node, and the first pull-down module is configured to pull-down the voltage level of the first node according to the voltage level of the fourth node, the stage signal of the next stage and the first low reference signal;
wherein the second pull-down module receives the stage signal of the previous stage, a reset signal and a second low reference signal and is electrically connected to a second node and a third node, the second pull-down module is configured to pull down a voltage level of the second node according to the reset signal, the second low reference signal and a voltage level of the third node;
wherein the first pull-down maintaining module receives the first low reference signal and is electrically connected to the first node, the second node and the fourth node, the first pull-down maintaining module is configured to maintain the voltage level of the first node according to the first low reference signal, a voltage of the second node and a voltage of the fourth node after the first pull-down module pulls down the voltage level of the first node;
wherein the second pull-down maintaining module receives the first low reference signal and a third low reference signal and is electrically connected to the second node, the fifth node, the sixth node and the seventh node, and the second pull-down maintaining module is configured to maintain voltage levels of the stage signal of the current stage, the first scan signal of the current stage and the second scan signal of the current stage according to the first low reference signal, the third low reference signal and the voltage of the second node;
wherein the logical addressing module receives the stage signal of the previous stage, a high reference signal, the first low reference signal, the reset signal, a first control signal, and a second control signal and is electrically connected to the first node and the second node, and the logical addressing module is configured to control the voltage level of the first node according to the stage signal of the previous stage, the high reference signal, the reset signal, the first control signal and the voltage level of the second node in a blank time period; and
wherein the inverter module receives the second low reference signal and the high reference signal and is electrically connected to the first node and the second node and the inverter module is configured to keep the voltage level of the second node has an inverting phase of the voltage level of the first node.

2. The GOA circuit of claim 1, wherein the pull-up control module comprises:
an 11th transistor and a 12th transistor;
wherein a gate and a source of the 11th transistor and a gate of the 12th transistor receive the stage signal of the previous stage, a drain of the 11th transistor and a source of the 12th transistor are electrically connected to the fourth node, and a drain of the 12th transistor is electrically connected to the first node.

3. The GOA circuit of claim 1, wherein the pull-up module comprises:
a 6th transistor, a 21st transistor, a 22nd transistor, a 23rd transistor, a first capacitor, and a second capacitor;
wherein a gate of the 6th transistor, a gate of the 21st transistor, a gate of the 22nd transistor, a gate of the 23rd transistor, a first end of the first capacitor and a first end of the second capacitor are electrically connected to the first node, a drain of the 6th transistor is electrically connected to the fourth node, a source of the 6th transistor, a second end of the first capacitor and a drain of the 22nd transistor are electrically connected to the sixth node, a source of the 21st transistor receives the third clock signal, a drain of the 21st transistor and a second end of the second capacitor are electrically connected to the seventh node, a source of the 22nd transistor receives the second clock signal, a source of the 23rd transistor receives the first clock signal, and a drain of the 23rd transistor is electrically connected to the fifth node.

4. The GOA circuit of claim 1, wherein the first pull-down unit comprises:
a 31st transistor and a 32nd transistor;
a gate of the 31st transistor and a gate of the 32nd transistor receive the stage signal of the next stage, a drain of the 31st transistor is electrically connected to the first node, a source of the 31st transistor and a drain of the 32nd transistor are electrically connected to the fourth node, and a source of the 32nd transistor is electrically connected to the first low reference signal.

5. The GOA circuit of claim 1, wherein the second pull-down unit comprises:
a 55th transistor, a 101st transistor, and a 102nd transistor;
wherein a gate of the 55th transistor receives the stage signal of the previous stage, a source of the 55th transistor and a source of the 102nd transistor receive the second low reference signal, a drain of the 55th transistor and a drain of the 101st transistor are electrically connected to the second node, a drain of the 102nd transistor is electrically connected to the third node, a drain of the 102nd transistor is electrically connected to a source of the 101st transistor, and a gate of the 101st transistor receives the reset signal.

6. The GOA circuit of claim 1, wherein the first pull-down maintaining unit comprises:
a 44th transistor and a 45th transistor;
wherein a gate of the 44th transistor and a gate of the 45th transistor are electrically connected to the second node, a drain of the 44th transistor is electrically connected to the first node, a source of the 44th transistor and a drain of the 45th transistor are electrically connected to the fourth node, and a source of the 45th transistor receives the first low reference signal.

7. The GOA circuit of claim 1, wherein the second pull-down maintaining unit comprises a 41st transistor, a 42nd transistor and a 43rd transistor;
wherein a gate of the 41st transistor, a gate of the 42nd transistor and a gate of the 43rd transistor are electrically connected to the second node, a source of the 41st transistor and a source of the 42nd transistor receive the third low reference signal, a drain of the 41st transistor is electrically connected to the seventh node, a drain of the 42nd transistor is electrically connected to the sixth node, a source of the 43rd transistor is electrically connected to the first low reference signal, and a drain of the 43rd transistor is electrically connected to the fifth node.

8. The GOA circuit of claim 1, wherein the logical addressing module comprises:
a 33rd transistor, a 34th transistor, a 71st transistor, a 72nd transistor, a 73rd transistor, a 81st transistor, a 82nd transistor and a third capacitor;
wherein a gate of the 33rd transistor is electrically connected to the second node, a source of the 33rd transistor receives the first low reference signal, a drain of the 33rd transistor is electrically connected to a source of the 34th transistor, a gate of the 34th transistor receives the first control signal, a drain of the 34th transistor is electrically connected to a drain of the 81st transistor and a source of the 82nd transistor, a gate of the 81st transistor, a gate of the 73rd transistor, a drain of the 72nd transistor and a second end of the third capacitor are electrically connected to the third node, a source of the 81st transistor is electrically connected to a drain of the 73rd transistor, a gate of the 82nd transistor receives the reset signal, a drain of the 82nd transistor is electrically connected to the first node, a first end of the third capacitor receives the high reference signal, a gate of the 71st transistor and a gate of the 72nd transistor receive the second control signal, a source of the 71st transistor receives the stage signal of the previous stage, a drain of the 71st transistor, a source of the 72nd transistor and a source of the 73rd transistor are electrically connected.

9. The GOA circuit of claim 1, wherein the inverter module comprises:
a 51st transistor, a 52nd transistor, a 53rd transistor and a 54th transistor;
wherein a gate and a source of the 51st transistor and a source of the 53rd transistor receive the high reference signal, a drain of the 51st transistor, a gate of the 53rd transistor and a drain of the 52nd transistor are electrically connected, a drain of the 53rd transistor and a source of the 54th transistor are electrically connected to the second node, a drain of the 54th transistor and a source of the 52nd transistor receive the second low reference signal, a gate of the 54th transistor and a gate of the 52nd transistor are electrically connected to the first node.

10. A display panel comprising a gate driver on array (GOA) circuit, the GOA circuit comprising:
a plurality of GOA circuits connected in series, each of the GOA circuits comprises a pull-up control module, a pull-down control module, a pull-up module, a first pull-down module, a second pull-down module, a first pull-down maintaining module, a second pull-down maintaining module, a logical addressing module and an inverter module;
wherein the pull-up control module receives a stage signal of a previous stage and is electrically connected to a first node and a fourth node, and the pull-up control module is configured to output the stage signal of the previous stage to the first node under control of the stage signal and a voltage level of the fourth node;
wherein the pull-up module receives a first clock signal, a second clock signal and a third clock signal and is electrically connected to the first node, a fifth node, a sixth node and a seventh node, and the pull-up module is configured to output a stage signal of a current stage, a first scan signal of the current stage and a second scan signal of the current stage under control of a voltage level of the first node;
wherein the first pull-down module receives a stage signal of a next stage and a first low reference signal and is electrically connected to the first node and the fourth node, and the first pull-down module is configured to pull-down the voltage level of the first node according to the voltage level of the fourth node, the stage signal of the next stage and the first low reference signal;
wherein the second pull-down module receives the stage signal of the previous stage, a reset signal and a second low reference signal and is electrically connected to a second node and a third node, the second pull-down module is configured to pull down a voltage level of the second node according to the reset signal, the second low reference signal and a voltage level of the third node;
wherein the first pull-down maintaining module receives the first low reference signal and is electrically connected to the first node, the second node and the fourth node, the first pull-down maintaining module is configured to maintain the voltage level of the first node according to the first low reference signal, a voltage of the second node and a voltage of the fourth node after the first pull-down module pulls down the voltage level of the first node;

wherein the second pull-down maintaining module receives the first low reference signal and a third low reference signal and is electrically connected to the second node, the fifth node, the sixth node and the seventh node, and the second pull-down maintaining module is configured to maintain voltage levels of the stage signal of the current stage, the first scan signal of the current stage and the second scan signal of the current stage according to the first low reference signal, the third low reference signal and the voltage of the second node;

wherein the logical addressing module receives the stage signal of the previous stage, a high reference signal, the first low reference signal, the reset signal, a first control signal, and a second control signal and is electrically connected to the first node and the second node, and the logical addressing module is configured to control the voltage level of the first node according to the stage signal of the previous stage, the high reference signal, the reset signal, the first control signal and the voltage level of the second node in a blank time period; and wherein the inverter module receives the second low reference signal and the high reference signal and is electrically connected to the first node and the second node and the inverter module is configured to keep the voltage level of the second node has an inverting phase of the voltage level of the first node.

11. The display panel of claim 10, wherein the pull-up control module comprises:

an 11th transistor and a 12th transistor;

wherein a gate and a source of the 11th transistor and a gate of the 12th transistor receive the stage signal of the previous stage, a drain of the 11th transistor and a source of the 12th transistor are electrically connected to the fourth node, and a drain of the 12th transistor is electrically connected to the first node.

12. The display panel of claim 10, wherein the pull-up module comprises:

a 6th transistor, a 21st transistor, a 22nd transistor, a 23rd transistor, a first capacitor, and a second capacitor;

wherein a gate of the 6th transistor, a gate of the 21st transistor, a gate of the 22nd transistor, a gate of the 23rd transistor, a first end of the first capacitor and a first end of the second capacitor are electrically connected to the first node, a drain of the 6th transistor is electrically connected to the fourth node, a source of the 6th transistor, a second end of the first capacitor and a drain of the 22nd transistor are electrically connected to the sixth node, a source of the 21st transistor receives the third clock signal, a drain of the 21st transistor and a second end of the second capacitor are electrically connected to the seventh node, a source of the 22nd transistor receives the second clock signal, a source of the 23rd transistor receives the first clock signal, and a drain of the 23rd transistor is electrically connected to the fifth node.

13. The display panel of claim 10, wherein the first pull-down unit comprises:

a 31st transistor and a 32nd transistor;

a gate of the 31st transistor and a gate of the 32nd transistor receive the stage signal of the next stage, a drain of the 31st transistor is electrically connected to the first node, a source of the 31st transistor and a drain of the 32nd transistor are electrically connected to the fourth node, and a source of the 32nd transistor is electrically connected to the first low reference signal.

14. The display panel of claim 10, wherein the second pull-down unit comprises:

a 55th transistor, a 101st transistor, and a 102nd transistor;

wherein a gate of the 55th transistor receives the stage signal of the previous stage, a source of the 55th transistor and a source of the 102nd transistor receive the second low reference signal, a drain of the 55th transistor and a drain of the 101st transistor are electrically connected to the second node, a drain of the 102nd transistor is electrically connected to the third node, a drain of the 102nd transistor is electrically connected to a source of the 101st transistor, and a gate of the 101st transistor receives the reset signal.

15. The display panel of claim 10, wherein the first pull-down maintaining unit comprises:

a 44th transistor and a 45th transistor;

wherein a gate of the 44th transistor and a gate of the 45th transistor are electrically connected to the second node, a drain of the 44th transistor is electrically connected to the first node, a source of the 44th transistor and a drain of the 45th transistor are electrically connected to the fourth node, and a source of the 45th transistor receives the first low reference signal.

16. The display panel of claim 10, wherein the second pull-down maintaining unit comprises a 41st transistor, a 42nd transistor and a 43rd transistor;

wherein a gate of the 41st transistor, a gate of the 42nd transistor and a gate of the 43rd transistor are electrically connected to the second node, a source of the 41st transistor and a source of the 42nd transistor receive the third low reference signal, a drain of the 41st transistor is electrically connected to the seventh node, a drain of the 42nd transistor is electrically connected to the sixth node, a source of the 43rd transistor is electrically connected to the first low reference signal, and a drain of the 43rd transistor is electrically connected to the fifth node.

17. The display panel of claim 10, wherein the logical addressing module comprises:

a 33rd transistor, a 34th transistor, a 71st transistor, a 72nd transistor, a 73rd transistor, a 81st transistor, a 82nd transistor and a third capacitor;

wherein a gate of the 33rd transistor is electrically connected to the second node, a source of the 33rd transistor receives the first low reference signal, a drain of the 33rd transistor is electrically connected to a source of the 34th transistor, a gate of the 34th transistor receives the first control signal, a drain of the 34th transistor is electrically connected to a drain of the 81st transistor and a source of the 82nd transistor, a gate of the 81st transistor, a gate of the 73rd transistor, a drain of the 72nd transistor and a second end of the third capacitor are electrically connected to the third node, a source of the 81st transistor is electrically connected to a drain of the 73rd transistor, a gate of the 82nd transistor receives the reset signal, a drain of the 82nd transistor is electrically connected to the first node, a first end of the third capacitor receives the high reference signal, a gate of the 71st transistor and a gate of the 72nd transistor receive the second control signal, a source of the 71st transistor receives the stage signal of the previous stage, a drain of the 71st transistor, a source of the 72nd transistor and a source of the 73rd transistor are electrically connected.

18. The display panel of claim 10, wherein the inverter module comprises:
- a 51st transistor, a 52nd transistor, a 53rd transistor and a 54th transistor;
- wherein a gate and a source of the 51st transistor and a source of the 53rd transistor receive the high reference signal, a drain of the 51st transistor, a gate of the 53rd transistor and a drain of the 52nd transistor are electrically connected, a drain of the 53rd transistor and a source of the 54th transistor are electrically connected to the second node, a drain of the 54th transistor and a source of the 52nd transistor receive the second low reference signal, a gate of the 54th transistor and a gate of the 52nd transistor are electrically connected to the first node.

\* \* \* \* \*